(12) United States Patent
Mazzillo

(10) Patent No.: US 8,648,437 B2
(45) Date of Patent: Feb. 11, 2014

(54) TRENCH SIDEWALL CONTACT SCHOTTKY PHOTODIODE AND RELATED METHOD OF FABRICATION

(75) Inventor: Massimo Cataldo Mazzillo, Corato (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 202 days.

(21) Appl. No.: 12/790,390

(22) Filed: May 28, 2010

(65) Prior Publication Data

US 2010/0301445 A1 Dec. 2, 2010

(30) Foreign Application Priority Data

Jun. 1, 2009 (IT) .............................. VA2009A0033

(51) Int. Cl.
| | |
|---|---|
| *H01L 27/095* | (2006.01) |
| *H01L 29/47* | (2006.01) |
| *H01L 29/812* | (2006.01) |
| *H01L 31/07* | (2012.01) |
| *H01L 31/108* | (2006.01) |

(52) U.S. Cl.
USPC 257/471; 257/473; 257/E27.04; 257/E29.338

(58) Field of Classification Search
USPC ............... 257/471, 473, 475, 484, E31.093, 257/E27.04, E29.338; 438/534, 575, 576
See application file for complete search history.

(56) References Cited

U.S. PATENT DOCUMENTS

| | | | | |
|---|---|---|---|---|
| 4,876,586 A | * | 10/1989 | Dyck et al. ..................... | 257/451 |
| 4,982,260 A | * | 1/1991 | Chang et al. .................. | 257/656 |
| 4,990,988 A | * | 2/1991 | Lin ............................... | 257/215 |
| 5,262,668 A | * | 11/1993 | Tu et al. ......................... | 257/475 |
| 5,365,102 A | * | 11/1994 | Mehrotra et al. .............. | 257/475 |
| 5,612,567 A | * | 3/1997 | Baliga ........................... | 257/475 |
| 6,078,090 A | * | 6/2000 | Williams et al. ............... | 257/476 |
| 6,399,996 B1 | * | 6/2002 | Chang et al. ................... | 257/484 |
| 6,501,145 B1 | * | 12/2002 | Kaminski et al. .............. | 257/471 |
| 6,707,127 B1 | * | 3/2004 | Hshieh et al. .................. | 257/483 |
| 6,768,177 B1 | * | 7/2004 | Xu et al. ......................... | 257/367 |
| 6,949,401 B2 | * | 9/2005 | Kaminski et al. .............. | 438/92 |
| 7,034,376 B2 | * | 4/2006 | Okada et al. ................... | 257/471 |

(Continued)

OTHER PUBLICATIONS

Mazzillo et al., "Highly efficient low reverse biased 4H-SiC schottky photodiodes for UV-light detection", Photonics Technology Letters, IEEE, Oct. 2009, pp. 1-4.

(Continued)

*Primary Examiner* — Hoai V Pham
(74) *Attorney, Agent, or Firm* — Allen, Dyer, Doppelt, Milbrath & Gilchrist, P.A.

(57) ABSTRACT

A Schottky photodiode may include a monocrystalline semiconductor substrate having a front surface, a rear surface, and a first dopant concentration and configured to define a cathode of the Schottky photodiode, a doped epitaxial layer over the front surface of the monocrystalline semiconductor substrate having a second dopant concentration less than the first dopant concentration, and parallel spaced apart trenches in the doped epitaxial layer and having of a depth less than a depth of the doped epitaxial layer. The Schottky photodiode may include a metal filler in the parallel spaced apart trenches to form a Schottky rectifying contact with the doped epitaxial layer, an anode current distributor metal layer on a surface of the doped epitaxial layer and in electrical contact with the metal filler of the parallel spaced apart trenches, a dielectric passivation layer on the anode current distributor metal layer, and a conductive metal layer over the rear surface of the monocrystalline semiconductor substrate and configured to provide an ohmic contact with the cathode.

11 Claims, 5 Drawing Sheets

(56) References Cited

U.S. PATENT DOCUMENTS

| | | | |
|---|---|---|---|
| 7,064,408 B2* | 6/2006 | Wu | 257/484 |
| 2001/0054715 A1* | 12/2001 | Collard et al. | 257/77 |
| 2002/0014669 A1* | 2/2002 | Widmann et al. | 257/374 |
| 2002/0125541 A1* | 9/2002 | Korec et al. | 257/471 |
| 2005/0184354 A1* | 8/2005 | Chu et al. | 257/458 |
| 2005/0202312 A1* | 9/2005 | Reshotko et al. | 429/103 |
| 2006/0263924 A1* | 11/2006 | Reshotko et al. | 438/57 |
| 2007/0103206 A1* | 5/2007 | Murakami et al. | 327/108 |
| 2008/0047600 A1* | 2/2008 | Ohashi et al. | 136/255 |
| 2009/0134486 A1* | 5/2009 | Fujikata | 257/449 |

OTHER PUBLICATIONS

Razeghi et al., "Semiconductor ultraviolet detectors", Applied Physics Review, vol. 79, No. 10, Jan. 1996, pp. 7433-7473.

* cited by examiner

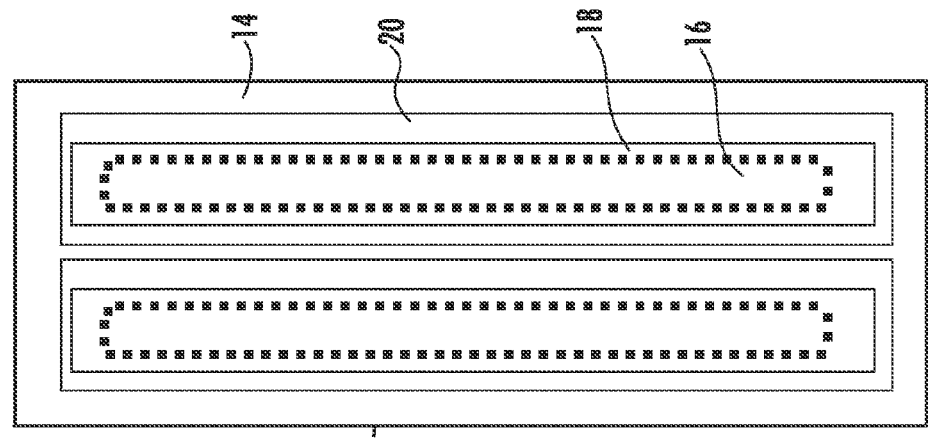
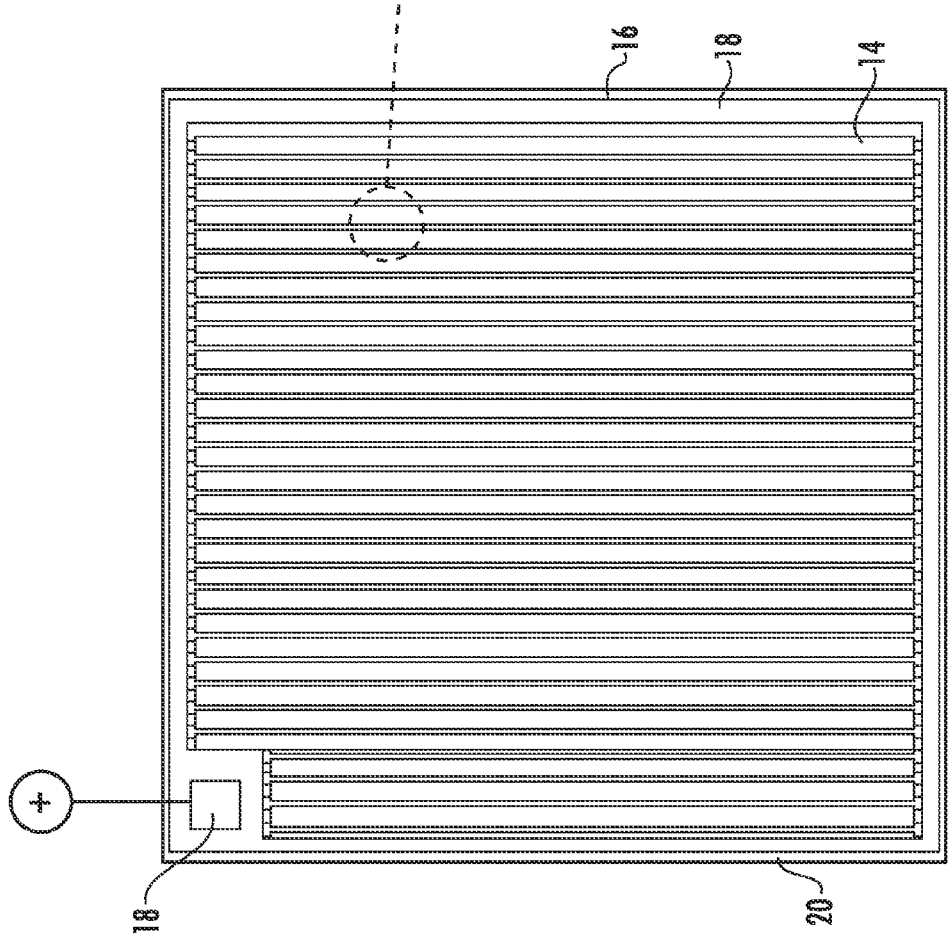

TRENCH SIDEWALL CONTACT SCHOTTKY PHOTODIODE AND RELATED METHOD OF FABRICATION

FIELD OF THE DISCLOSURE

The present disclosure relates to the field of photo-detectors, and, more particularly, to a Schottky photodiode photodetector and related methods.

BACKGROUND

Ultraviolet (UV), vacuum ultraviolet (VUV), and extreme ultraviolet (EUV) (5-380 nm) photo-detectors have been widely used in the field of astronomy, EUV lithography, x-ray microscopy, plasma physics, UV curing and flame detection monitoring. Another relevant application is for non-line-of-sight (NLOS) communications. A wireless optical communication system relies on an optical wave with wavelength ranging from infrared, visible light, to UV to convey information. Compared with an RF system, it shows several potential advantages, such as huge unlicensed bandwidth, low-power and miniaturized transceiver, higher power densities, high resistance to jamming, and potential increase of data rate. In the wireless optics domain, infrared and UV waves are very valuable carriers.

Large unregulated bandwidth, which is virtually free of multiple access interference conditions, is commercially attractive while inherent security characteristics receive the military's attention. Similar to a radio frequency (RF) link, a typical wireless optical communication link comprises of an information source, modulator, transmitter, propagation channel, and receiver. To generate an optical source, solid state light-emitted diodes (LEDs), laser tubes and solid state laser diodes (LD) can be used. For detection, the optical receiver may comprise a lens-focusing and filtering subsystem, photo-detector (normally a photo-multiplier based on a vacuum tube), and post detection processor. Optical lenses and filters are made of selected wavelength-sensitive materials to extract the desired optical field. The photo-detector is made of photosensitive materials and produces free electrons with incident photons. Of course, a high sensitivity detector that does not use filters (to block the visible light), lens and vacuum tubes would be quite advantageous for system miniaturization.

Many UV applications use detectors with high responsiveness, very low dark current, and good radiation hardness. In astrophysics, blindness to visible solar radiation is also extremely important, especially for solar study in the EUV region, where the signals are relatively weak and the out-of-band signals, such as the visible components of the solar background, are often many orders of magnitude stronger than the EUV signal of interest. In the consumer sector, solar blind UV detectors would avoid the low efficiency and errors typical of infrared detectors when directly exposed to the solar light or strongly illuminated. NLOS communications in many consol applications that need to communicate with terminals that may intermittently become obscured by physical obstacles (play stations) could also be an area of application.

In recent years, a remarkable progress in the epitaxial growth technologies and in device processing of wide band gap semiconductors, including SiC, has been accomplished, which to date allows the fabrication of p-i-n, avalanche, metal-semiconductor-metal and Schottky barrier devices for UV detection. Photo-detectors use a low dark current, so high quality electronic materials may be necessary. Wide band gap semiconductors offer an ideal dark current that can be several orders of magnitude lower than silicon. In particular, 4H—SiC has an electronic quality that makes it reliably approach the ideal dark current even in relatively large diameter wafers. Moreover, as the only material among the known wide band gap semiconductors, 4H—SiC to have been tested for UV detection with the highest cutoff wavelength at 380 nm ($E_g$=3.26 eV) below the low end of the visible wavelength range (400 nm) and has been proved to be a very promising candidate for the development of visible-blind UV detectors [1].

Some publications have reported p-i-n and avalanche UV detectors realized on SiC with good UV photo detection [2]. For example, U.S. Pat. No. 5,093,576 to Edmond et al. discloses a pn junction photodiode formed in a silicon carbide substrate [3], and U.S. Pat. No. 7,002,156 to Sandvik et al. discloses a detection system including a SiC avalanche photodiode for use in harsh environments [4].

However, in order to enhance sensitivity at short wavelengths, metal-semiconductor (Schottky) diodes are preferred to p-i-n and junction diodes, as the carrier generation occurs in the space-charge region, i.e. at the semiconductor surface, with high built-in electric field. Moreover, Schottky diodes are majority carrier devices, thus allowing a faster response than p-n junctions. Finally, Schottky diodes typically have a simpler fabrication processes than p-i-n and junction structures. Metal-semiconductor photodiodes are particularly used for detection of high photon rates fluxes in the ultraviolet and visible-light regions. In fact, the absorption coefficients $\alpha$ in these regions is very high, of the order of $10^4$ cm$^{-1}$ or more, for most of the common semiconductors, which corresponds to an effective absorption length $1/\alpha$ of 1.0 µm or less. However, in Schottky photodiodes to avoid large reflection and absorption losses when the diode is illuminated from the top, the metal film should to be very thin while antireflection coatings may be used to reduce the metal shining. A Metal-Semiconductor photodiode is disclosed in U.S. Pat. No. 4,763,176 to Masanori.

Typical Schottky-type SiC UV photodiodes use "semitransparent" continuous thin metal layers (<20 nm) with high values [1.4-1.8 eV] of the Schottky barrier on SiC (Ni, Au, Pt)[6]. However, these Schottky-type devices show a relatively low sensitivity in the wavelength range 200-250 nm, due to the low penetration depth of the UV radiation in the metal. In order to improve the quantum efficiency of SiC photo-detectors, one approach includes further reducing the thickness of the semitransparent film [7]. However, this approach can lead to a difficult control of the uniformity of an ultra thin Schottky barrier, beyond being detrimental for the mechanical and thermal stabilities of the contact.

The direct exposure to radiation of the optically active area, i.e. the depletion region of the junction, could be an alternative to improve the detector sensitivity at short wavelengths. With this aim, approaches such as planar p-i-n structures, with the intrinsic region directly exposed to radiation, or innovative semitransparent Schottky metallizations are actually under study. For example, metal-semiconductor-metal 4H—SiC photodiodes, using Ni/ITO interdigit contacts, were recently proposed by Chiou allowing the Schottky operation and the optically active area direct radiation exposure [6]. Finally, Sciuto et al. in [6] demonstrated high responsiveness 4H—SiC vertical Schottky UV photodiodes based on the pinch-off surface effect, obtained by way of self-aligned Nickel Silicide interdigit contacts. These planar detectors with the active area directly exposed to the optical flux allow an improvement of the sensitivity at short wavelengths [6].

The absorption coefficient of the electromagnetic radiation in silicon carbide decreases at a great rate for long wavelengths. Cha et al. in [8] disclose the absorption coefficient spectrum in 4H—SiC. As it can be seen in this reference, the absorption coefficient decreases at a great rate for wavelengths longer than 280-290 nm, due to the loss of efficiency of the absorption mechanisms (indirect transitions) for photons of these wavelengths. At 350 nm, for example, the absorption length of 4H—SiC is 35 μm [9], that is about the 67% of the incident optical flux at this wavelength is absorbed in an active layer thick 35 μm. This means that it may be necessary to increase as much as possible the thickness of the active area in silicon carbide photodiodes in order to enhance the absorption and consequently the detection efficiency at the high wavelength end of the sensitivity range of the material. On the other hand, the lower the wavelength, the higher the absorption coefficient.

The feasibility of deep trenches etched in lightly doped thick SiC epitaxial layers and filled with metal has been demonstrated in various publications. Abbondanza et al. [10] disclose a method for growing low defect and high thickness (up to 150 microns) silicon carbide epilayers onto silicon carbide substrates. Likewise, the etching of high aspect ratio deep trenches (>100 μm) in silicon carbide using Deep Reactive Ion Etching (DRIE), as well as time-multiplexed etch-passivation (TMEP) process, which alternates etching with polymer passivation of the etch sidewalls, has been reported by various authors (for example, Evans et al [11]). Finally, S. Grunow et al. [12] discloses a method for forming conductive structures by filling trenches with a metal.

SUMMARY

The structure disclosed herein may offer advantages over prior art structures and may be defined as a trench sidewall contact Schottky photodiode. Differently from planar devices, this structure may be a vertical semi-conducting device with one electrode in the bulk of the device and the other one at the rear of the wafer.

More specifically, the ohmic contact is on the bottom surface of the device while the rectifying (Schottky) contact is created in the bulk of the semiconductor by filling deep trenches etched in a lightly doped epitaxial layer with a high Schottky barrier metal. Application of a reverse bias of comparatively low value to the metal inside the trenches allows creation of wide depletion regions (active area of the device) all around the trenches due to a very light doping of the epitaxial layer.

The possibility of growing lightly doped silicon carbide epilayers of high thickness and low defects and to etch deep trenches of high aspect ratio in an epilayer of silicon carbide and fill them with high barrier Schottky metal, has been found to offer a powerful tool for modulating the thickness of the depletion layer (active area region) and thus to maximize the photodiode detection efficiency also at the high end of the sensitivity range, apart from short wavelength photons whose absorption is almost complete within a few microns from the impinged silicon carbide surface.

The pinch off condition among adjacent depletion regions around the metal strips inside the trenches corresponds to the condition of maximum detection efficiency because, in this case, all the silicon carbide area between neighboring metal filled trenches is active (i.e. depleted). The light doping of the epilayer allows creation of wide depletion regions at low reverse bias.

Therefore, by suitably designing the distance among adjacent trenches, the pinch-off condition can be reached at low reverse bias or even in a photovoltaic region (0 V bias). Because the structure disclosed herein has deep trenches filled with metal in thick highly doped epilayers, the pinch off condition not only is reached at a relatively low reverse bias, but also corresponds to the maximum detection efficiency condition in all the sensitivity ranges (for low as well as for high wavelengths) of silicon carbide semiconductor.

This condition is of paramount importance for possible application of a silicon carbide photo-detector in low power consumption applications where low reverse bias may be applied for the detection of weak photon fluxes in all the UV range (200-400 nm). Notably, some semiconductors may use photodiodes and their respective wavelength ranges of sensitivity include: Silicon: 190-1100 nm; Germanium: 400-1700 nm; Indium Gallium Arsenide: 800-2600 nm; and 4H-Silicon Carbide: 200-380 nm. The structure of trench sidewall contact Schottky photodiode may be realized using any of the above indicated semiconductors.

For example, fabrication of the photodiode structure in silicon or germanium would be much simpler than in silicon carbide because the epitaxial growth of lightly doped thick epitaxial layers on silicon and on germanium as well as etching and filling high aspect ratio trenches therein are long established standard processes of semiconductor device manufacturing. However, the different absorption spectrum of the material (for example, in silicon the absorption becomes negligible for wavelengths longer than 750-800 nm [13]) and the different barrier height of the Schottky contact formed between the metal inside the trenches and the lightly doped epilayer may need to be considered in designing the photodiode structure of this disclosure.

In the efficient photodiode structure that is obtained with the method of this disclosure, the thickness of the depleted region may be modulated by reducing the depth of trenches and eventually even the thickness of the lightly doped silicon carbide epilayer itself may be reduced in order to reduce the sensitivity of the device at higher wavelengths. In fact, the probability of absorption of high wavelength photons may be significantly lowered by reducing the thickness of the epilayers and using shorter trenches.

These trimmerable fabrication parameters may be profitably used in many applications where only photons with a wavelength shorter than a higher cut-off wavelength (for example, less than 300 nm for silicon carbide) may be selectively detected.

Finally, the metal electrode of the photodiode (typically tungsten or aluminum) set in deep trenches may greatly reduce unwanted cross talk effects among adjacent photodiodes in arrays of integrated photo-detectors or among neighboring points of the sensitive area of the single integrated photo-detector. Metal fillers such as W and Al have properties that may allow them to be deposited under conditions of highly conformal deposition at temperatures lower than 500° C. and are opaque to the radiation band of interest, which, for silicon carbide photodiodes, may be from 200 nm to 400 nm.

BRIEF DESCRIPTION OF THE DRAWINGS

FIG. 2 is a general layout view of an integrated trench sidewall contact Schottky photodiode, according to the present disclosure.

FIG. 3 is an enlarged detailed view of the layout profiles of the integrated regions of the trench sidewall contact Schottky photodiode structure, according to the present disclosure.

The cross sectional views and in general all the drawings have only a purely illustrative purposes. In particular, geometrical features are not drawn in scale, but to provide a quick recognition of their relative arrangement.

DETAILED DESCRIPTION OF THE PREFERRED EMBODIMENTS

Figure 1:
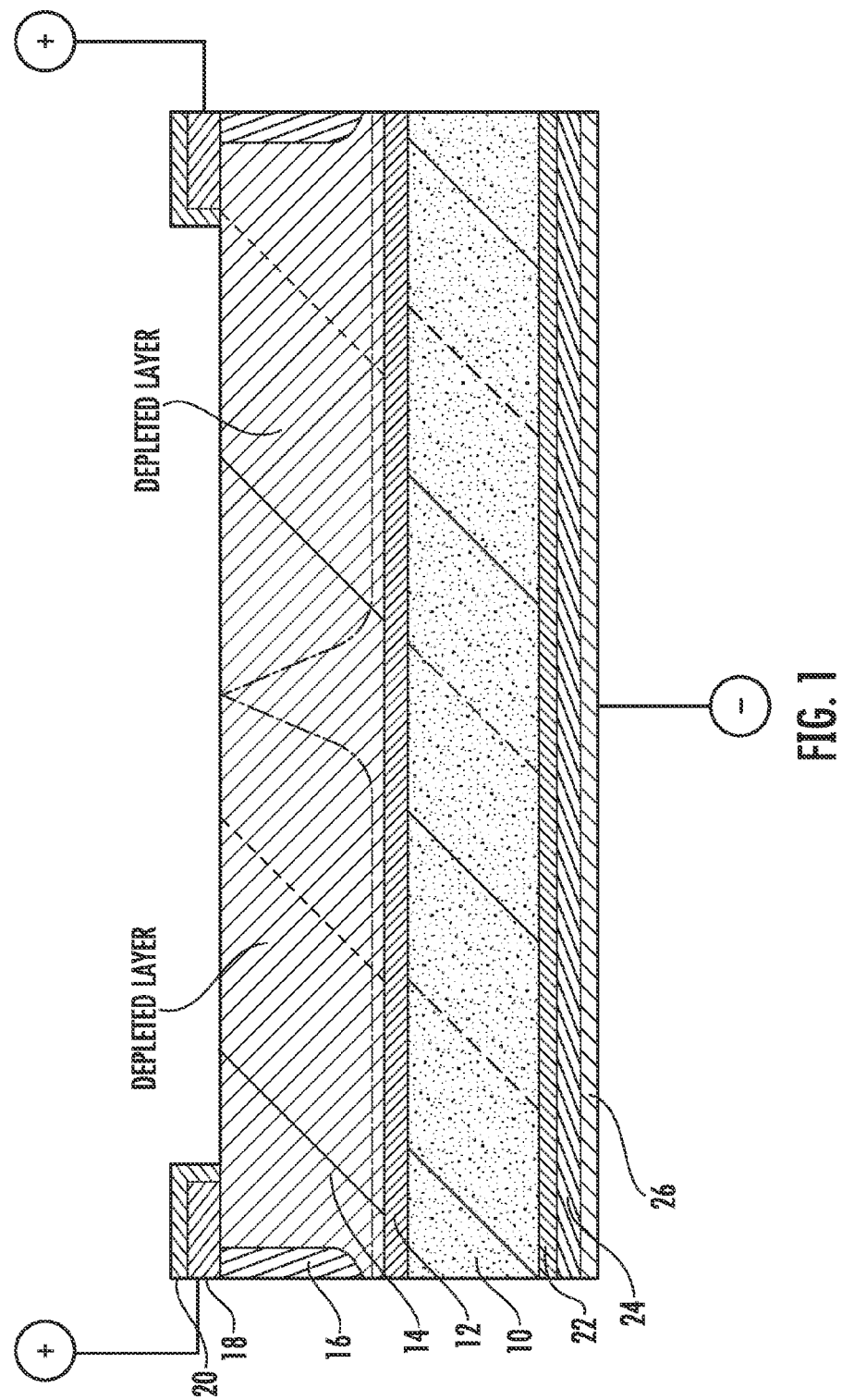
FIG. 1 is a cross-sectional view of an integrated trench sidewall contact Schottky photodiode, according to the present disclosure.
Figure 4:
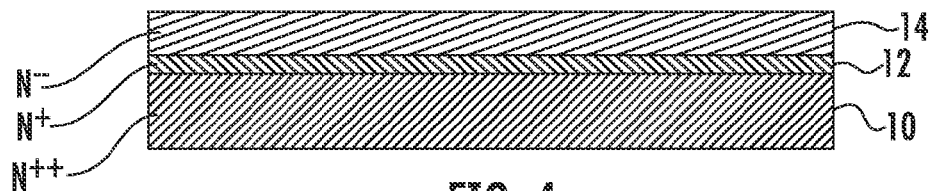
FIGS. 4 to 14 are schematic side views illustrating steps of the fabrication process of a silicon carbide Schottky photodiode, according to the present disclosure.

An embodiment of the present disclosure will now be described in detail with reference to the drawing of FIG. 1, representing a cross sectional view in the active area of a trench sidewall contact Schottky photodiode of this disclosure. The photodiode structure according to the exemplary embodiment shown comprises a heavily doped, $N^+$ semiconductor substrate 10, a relatively thin N doped epitaxial buffer layer 12, grown on the substrate 10, and a second, relatively thick, lightly doped $N^{--}$ epitaxial layer 14, grown on the buffer epitaxial layer 12.

In case the semiconductor is nitrogen doped silicon carbide, according to an embodiment useful as photo-detector in the wavelength range of 200-380 nm, the dopant concentration of the substrate 10 may be in the range 1E18-1E19 atoms/$cm^{-3}$ and the dopant concentration of the thin epitaxial buffer layer 12 and of the thick epitaxial layer 14 may be in the ranges 1E17-1E18 atoms/$cm^{-3}$ and 1E13-1E15 atoms/$cm^{-3}$, respectively. The substrate may have a thickness in the range 350-400 μm, the epitaxial buffer layer 12 may have a thickness in the range 0.5-1 μm, and the lightly doped thick epitaxial layer 14 may have a thickness in the range 3-150 μm.

The heavily doped substrate 10 provides for a bottom cathode ohmic contact with an appropriate metallization of the whole rear surface of the substrate connectable to a photo-detector circuitry. The rear metallization may be a stack comprising a first barrier layer usually of titanium 22, a second layer 24 usually of nickel or platinum, and a topping layer 26 usually of gold, though other metallization stacks may be used.

The thin epitaxial layer 12 acts as buffer layer on which a thick lightly doped epilayer 14 may be grown. The light doping of the thick $N^{--}$ epitaxial layer 14 provides for wide space charge (i.e. depleted) regions in order to enhance collection efficiency of photogenerated carriers in the thick $N^{--}$ epilayer, even with a relatively low reverse bias. A tungsten, aluminum or other metal 16 fills the narrow and deep trenches (i.e. of high aspect ratio) cut in the thick lightly doped epilayer 14 for a depth insufficient to reach the bottom of the layer, establishing a Schottky rectifying contact with the semiconductor and constitutes the anode of the photodiode.

The equipotential characteristic of the Schottky metal filler of all the trenches belonging to a single integrated photodiode, that may be cut parallel to each other with a certain uniform spacing that may be about twice the maximum lateral extension of the depleted region in the lightly doped epilayer 14 at the design bias of the photodiode, is provided by a metal anode current collecting metal layer 18, for example of an aluminum-silicon-copper layer sputtered over the surface and defined to form a capping in electrical contact with the metal filler 16 of the trenches. Of course, in normal fabrication practices, the metal layer 18 of anode current distribution will be simultaneously defined over a plurality of integrated structures of photodiodes being fabricated on a same wafer for producing, by dicing of the wafer, single photo-detectors or "bit-arrays" each comprising a certain number of distinctly connectable photo-detectors, sharing a common cathode ohmic contact.

The profiles traced with dot-dash-dot lines show how a pinch-off condition of adjacent depleted regions should be reached at the design reverse bias voltage applied between cathode and anode of the photodiode (which in some applications may even be null and a pinch-off condition be nevertheless reached under purely photovoltaic regime (i.e. 0 V bias).

A common dielectric passivation coat layer 20, for example a partly oxidized silicon nitride layer, on the patterned metal anode current collector, completes the vertical structure of the trench sidewall contact Schottky photodiode of this disclosure. Of course, the metal anode current collecting metal layer 18 may have a pad area on which wire bonding connection of the anode to the photo-detector circuitry can be established.

A general layout view of an integrated trench sidewall contact Schottky photodiode of the above illustrated structure, showing an array of uniformly spaced parallel trench contacts and a corner pad area for wire bonding is provided in FIG. 2. FIG. 3 is an enlarged detail view of the layout profiles of the integrated regions of the trench sidewall contact Schottky photodiode structure.

An exemplary fabrication process flow relative to the manufacture of a trench sidewall contact Schottky photodiode of this disclosure with silicon carbide (SiC) will now be described with reference to FIGS. 4-14. With reference to the FIG. 4, on a monocrystalline semiconductor substrate in the form of a nitrogen doped $N^{++}$ silicon carbide slice 10, an optional though generally preferred, first relatively thin nitrogen doped epitaxial N layer 12 is grown on the front side of the substrate 10. The dopant concentration for the thin N epitaxial layer 12 may be approximately 1E17 or up to about 1E18 atoms/$cm^{-3}$ and its thickness may be approximately 0.5-1.0 μm.

Figure 5:
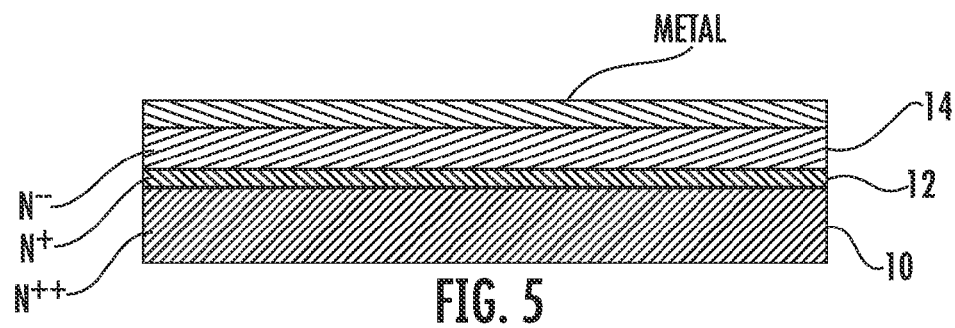

A second relatively thick nitrogen doped $N^{--}$ epitaxial layer 14 is grown over the first thin N epitaxial layer 12. The dopant concentration of the thick $N^{--}$ epitaxial layer 14 may be approximately 1E13 or up to about 1E15 atoms/$cm^{-3}$ and its thickness may be range from about 3 up to about 150 μm. The optional first epitaxial layer 12 acts as buffer layer on which growing the thick, lightly doped, active semi-conducting region 14 of wide space charge region from where photogenerated carriers at low reverse bias or even at 0 V bias. A zero-layer photomask can be used for the definition of alignment marks according to common practices in the art. Then, as depicted in FIG. 5, a sacrificial metal layer (METAL) for example Nickel, or Aluminum, is sputtered on the front side of the wafer. The thickness of this metal layer may be in the range 1-10 μm, depending on the depth of the trench to etched in the lightly doped, thick epilayer 14 of $N^{--}$ silicon carbide.

Figure 6:
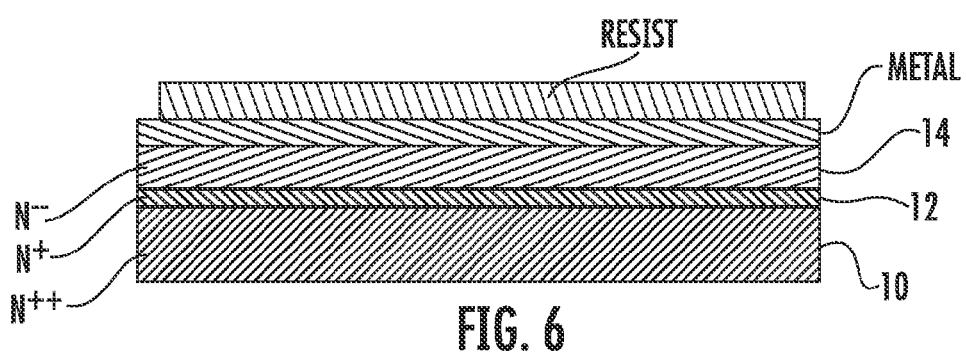
Figure 7:
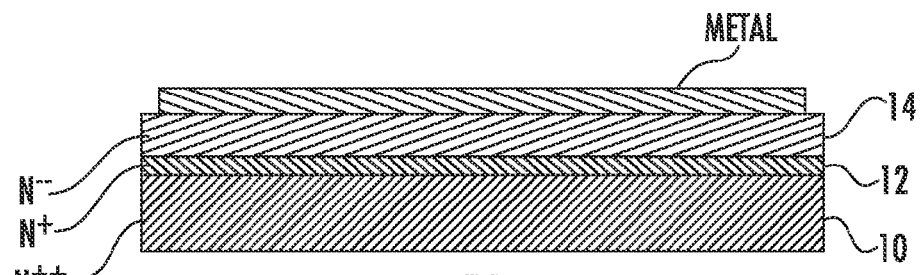

As depicted in FIG. 6, by a first lithography step, a resist mask (RESIST) defines an array of uniformly spaced parallel trenches (according to the exemplary layout views of FIGS. 2 and 3). Then, with a calibrated etch process (dry or wet) conducted through the openings of the resist mask (RESIST), the sacrificial metal layer (METAL) is removed completely from the areas (A) where trenches in the silicon carbide will be successively cut through the so defined openings in the metallic hard mask, and finally the resist mask is stripped off, as depicted in FIG. 7.

Figure 8:
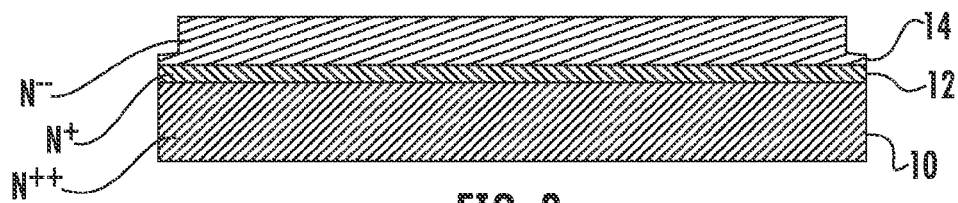

With an anisotropic calibrated dry etch conducted through the openings of the metallic hardmask, deep trenches (T) are cut into the silicon carbide of the thick lightly doped epilayer 14, and finally, the residual metal of the hard mask is removed by selective wet etch, leaving the structure schematically shown in FIG. 8. The depth of the trenches (T) may be insufficient to reach the bottom of the N$^{--}$ epilayer 14 or even extend down as far as reaching the bottom of the N$^{--}$ epilayer in case there is a buffer epilayer 12, as in the considered example. Essentially, there should not be any short circuiting condition with the ohmic contact to be formed on the bottom of the wafer. The designer will opt to extend down the cut trenches as far as possible in order to provide for the maximum possible depth (thickness) of the depletion region along the two sides of the trench Schottky contact or to etch more narrow trenches to reduce absorption of high wavelength photons, if this is desired by the particular application of the photodiode.

Figure 9:
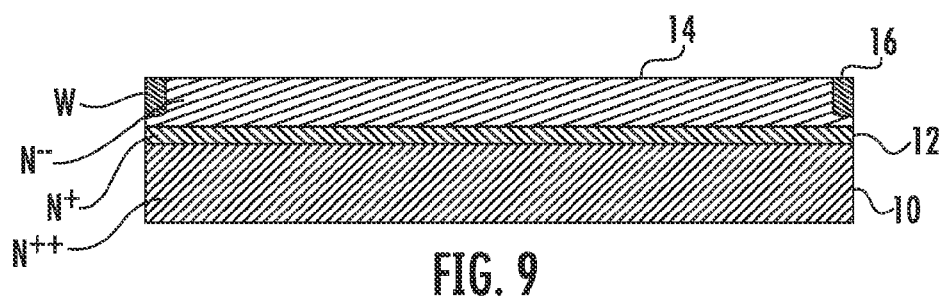

At this point of the process, to complete the active structure and the optical isolation between adjacent pixels, a metal layer 16 of Schottky contact (for example of tungsten) is deposited with a CVD process to completely fill the trenches up to the top, and with a tungsten etchback process, the metal is removed from the planar front surface the device, producing the structure schematically depicted in FIG. 9.

Figure 10:
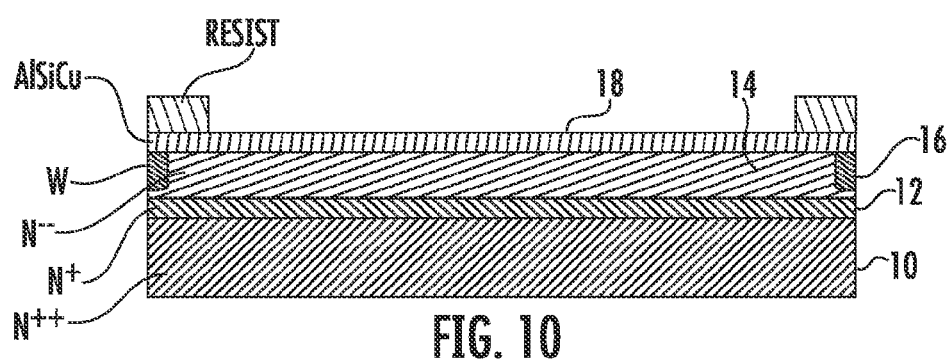
Figure 11:
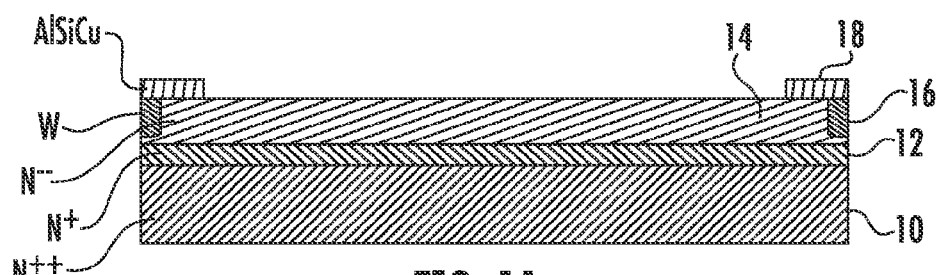

After that, a standard metal layer 18, for example an Al—Si—Cu ternary mixture/alloy, can be sputtered on the front surface of the wafer to contact the Schottky contact metal filler 16 of the trenches. The thickness of this metal layer 18 may be comprised in the range of 1 to 3 μm. By a second photolitography step, a resist mask (RESIST) is produced, as depicted in FIG. 10. By a selective wet etch process, the metal is removed from the surface of the device in the areas of separation among the trenches and after stripping of the masking resist, the structure depicted in FIG. 11 is obtained.

Figure 12:
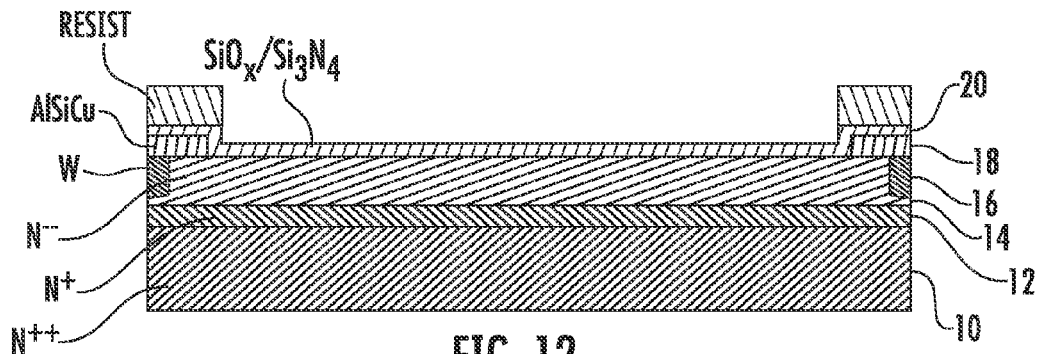

Then, a passivation layer 20, for example of silicon nitride or oxynitride, is deposited on the front of the wafer to coat the patterned metal layer 18. The thickness of this passivation layer 20 can be in the range from 0.3 to 1.0 μm. A third photolithography step a resist mask (RESIST) is produced, as depicted in FIG. 12.

Figure 13:
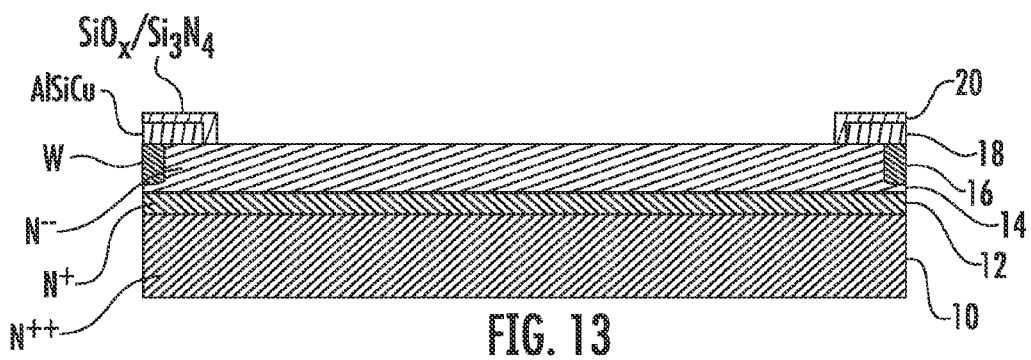

A dry etch process can be used for removing the passivation layer 20 in the areas of separation among the trenches defined by the openings of the resist mask that at the end of the etch may be stripped off, leaving the structure depicted in FIG. 13. A dielectric passivation layer strongly absorbs the radiation in the ultraviolet wavelength range eventually impeding detection of incident photons by the silicon carbide Schottky photodiode; therefore, it may be necessary to remove this layer between the parallel metal stripes in order to retain a high quantum efficiency in the UV range.

A sintering process at low temperature (generally at 400-450° C.) in hydrogen can be used to reduce the surface electronic states concentration and consequently the SRH (Schokley-Read-Hall) generation rate and the leakage current of the device.

A silicon carbide device usually exhibits a low thermal carrier generation due to the high energy gap of this material (about 3.26 eV for the 4H—SiC polytype). However, some silicon carbide devices may present a higher dark current due to a non-optimized manufacturing process or poor quality of the substrate and the epitaxial SiC layers. A low dark current is helpful for the proper working of a photo-detector permitting to set a lower magnitude limit to detectable signals. An excessively high dark current can impede the use of an SiC Schottky photodiode in many applications where weak photon fluxes may be detected, for example in astrophysical applications, where the photocurrent generated by the absorption of photons in the active area of the device may result many orders of magnitude lower than a particularly large leakage current. The main sequence of fabrication steps ends with the deposition of a metallization layer over the bottom surface of the SiC wafer of substrate 10, to establish the cathode ohmic contact of the vertical photodiode.

Figure 14:
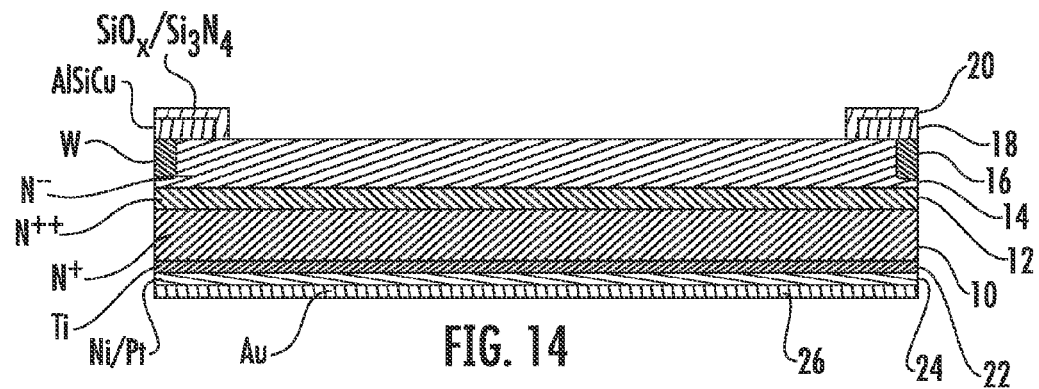

According to the exemplary process of the illustrated embodiment, three different metallic layers can be sputtered in succession on the rear surface of the substrate 10, as schematically depicted in FIG. 14. A first deposited layer 22 may be of a commonly used barrier metal such as titanium. The second deposited layer 24 may be of nickel or of platinum, and a third and last layer 26 may commonly be of gold.

The thickness of the barrier layer 22 may be in the range of 50-100 nm, that of the second layer 24 in the range of 200-500 nm, while the thickness of the outermost layer 26 may be in the range of 20-50 nm. The anode metallization layer 18 ensures easy wire bonding on the defined pad area, visible in the layout view of FIG. 2, (usually with aluminum or gold wires) while the metallic stack 22, 24, 26 at the rear of the wafer ensures an efficient die attach with soft solders or even with conductive adhesives.

Application of a low reverse bias voltage to the Schottky contact metal/semiconductor over the vertical side walls of the trenches creates in the flanking lightly doped semiconductor epilayer 14, depleted regions. By suitably designing the distance of separation between adjacent trenches, the pinch-off condition between adjacent depleted regions can be reached even at relatively low reverse bias or even under purely photovoltaic regime (0V bias).

Likewise the above-illustrated fabrication process for a single or for an array of SiC Schottky photodiodes (to constitute a bit-array photodetector) and the method of this disclosure may be followed by a realization of the trench sidewall contact Schottky photodiode with other monocrystalline semiconductor materials, suited to the wavelength range of the specific application, (e.g. silicon). In case of silicon, dielectric materials like silicon oxide, silicon nitride or oxynitride may conveniently be used as hard mask materials for the etching of the trenches.

REFERENCES

[1] M. Razeghi and A. Rogalski, Semiconductor ultraviolet detectors, Applied Physics Reviews, Vol. 79, No. 10, pp. 7433-7473, 1996.

[2] P. Sandvik*, K. Burr, S. Soloviev, S. Arthur, K. Matocha, J. Kretchmer, Leo Lombardo, D. Brown, Sic Photodetectors for industrial applications, IEEE Lasers and Electro-Optics Society, 2005. LEOS 2005, pp. 319-320.

[3] J. A. Edmond and C. H. Carter, High sensitivity ultraviolet radiation detector, US 005093576A, March 1992

[4] P. Sandvik, D. M. Brown, S. D. Arthur, K. S. Matocha and J. W. Kretchmer, Detection system including avalanche photodiode for use in harsh environments, U.S. Pat. No. 7,002,156B2, February 2006.

[5] I. Masanori, Metal-Semiconductor-Metal Photodiode, U.S. Pat. No. 4,763,176, July 1987.

[6] A. Sciuto, F. Roccaforte, V. Raineri, S. Di Franco, G. Bonanno, High responsivity 4H—SIC Schottky UV photodiodes based on the pinch-off surface effect, Applied Physics Letters, Vol. 89, 081111, 2006.

[7] F. Yan, X. Xin, S. Aslam, Y. Zhao, D. Franz, J. H. Zhao, and Maurice Weiner, 4H—SiC UV Photo Detectors With Large Area and Very High Specific Detectivity, IEEE J. Quantum Electron. Vol. 40, No. 9, pp 1315-1320, 2004.

[8] H. Y. Cha and P. M. Sandvik, Electrical and Optical Modeling of 4H—SiC Avalanche Photodiodes, Japanese Journal of Applied Physics, Vol. 47, No. 7, pp. 5423-5425, 2008.

[9] J. Hu, X. Xin, X. Li, J. H. Zhao, B. L. VanMil, K. Lew, R. L. Myers-Ward, C. R. Eddy, Jr., and D. K. Gaskill, 4H—SiC Visible-Blind Single-Photon Avalanche Diode for Ultraviolet Detection at 280 and 350 nm, IEEE Transactions on Electron Devices, Vol. 55, No. 8, pp. 1977-1982, 2008.

[10] G. Abbondanza and D. Crippa, Process for producing a silicon carbide substrate for microelectronics applications, WO 2008080384.

[11] L. J. Evans and G. M. Beheim, Deep Reactive Ion Etching (DRIE) of High Aspect Ratio SiC Microstructures using a Time Multiplexed Etch-Passivate Process www.ntrs-.nasa.gov/archive/nasa/casi.ntrs.nasa.gov/20 060005134_2006005298.pdf

[12] S. Grunow, A. Kumar Kaushik, K. S. Petrarca, P. R. Volant, Method for forming conductive structures, US 2009017616.

[13] S. M. Sze, Semiconductor Devices Physics and Technology. New York: Wiley, 1985.

That which is claimed is:

1. A Schottky photodiode comprising:
a semiconductor substrate having a front surface, a rear surface, a lateral edge, and a first dopant concentration and configured to define a cathode of the Schottky photodiode;
an epitaxial layer over the front surface of said semiconductor substrate having a second dopant concentration less than the first dopant concentration;
a plurality of parallel spaced apart trenches in said epitaxial layer and having of a depth less than a depth of said epitaxial layer;
a metal filler in said plurality of parallel spaced apart trenches to form a trench sidewall Schottky rectifying contact with said epitaxial layer, the trench sidewall Schottky rectifying contact being at the lateral edge and providing lateral optical isolation;
an anode current distributor metal layer over a surface of said epitaxial layer and in electrical contact with said metal filler of said plurality of parallel spaced apart trenches;
a dielectric passivation layer over said anode current distributor metal layer; and
a conductive layer over the rear surface of said semiconductor substrate and configured to provide an ohmic contact with the cathode.

2. The Schottky photodiode of claim 1 wherein the first dopant concentration is between 1E18 and 1E19 atoms/$cm^3$.

3. The Schottky photodiode of claim 1 wherein the second dopant concentration is between 1E13 and 1E15 atoms/$cm^3$; and wherein said epitaxial layer has a thickness between 3 and 150 µm.

4. The Schottky photodiode of claim 1 wherein said semiconductor substrate is monocrystalline.

5. The Schottky photodiode of claim 1 further comprising an epitaxial buffer layer between the front surface of said semiconductor substrate and said epitaxial layer and having a dopant concentration between 1E17 and 1E18 atoms/$cm^3$ and a thickness between 0.5 and 1.0 µm.

6. The Schottky photodiode of claim 1 wherein said semiconductor substrate and said epitaxial layer are nitrogen doped silicon carbide.

7. The Schottky photodiode of claim 1 wherein said conductive layer comprises a conductive metal layer.

8. A Schottky photodiode comprising:
a semiconductor substrate having a front surface, a rear surface, a lateral edge, and a first dopant concentration and configured to define a cathode of the Schottky photodiode;
a first epitaxial buffer layer over the front surface of said semiconductor substrate;
a second epitaxial layer over said first epitaxial buffer layer having a second dopant concentration less than the first dopant concentration;
a plurality of parallel spaced apart trenches in said second epitaxial layer and having of a depth less than a depth of said second epitaxial layer;
a metal filler in said plurality of parallel spaced apart trenches to form a trench sidewall Schottky rectifying contact with said second epitaxial layer, the trench sidewall Schottky rectifying contact being at the lateral edge and providing lateral optical isolation;
an anode current distributor metal layer over a surface of said second epitaxial layer and in electrical contact with said metal filler of said plurality of parallel spaced apart trenches;
a dielectric passivation layer over said anode current distributor metal layer; and
a conductive layer over the rear surface of said semiconductor substrate and configured to provide an ohmic contact with the cathode.

9. The Schottky photodiode of claim 8 wherein the first dopant concentration is between 1E18 and 1E19 atoms/$cm^3$.

10. The Schottky photodiode of claim 8 wherein the second dopant concentration is between 1E13 and 1E15 atoms/$cm^3$; and wherein said second epitaxial layer has a thickness between 3 and 150 µm.

11. The Schottky photodiode of claim 8 wherein said semiconductor substrate, said first epitaxial buffer layer, and said second epitaxial layer are nitrogen doped silicon carbide.

* * * * *

UNITED STATES PATENT AND TRADEMARK OFFICE
CERTIFICATE OF CORRECTION

PATENT NO. : 8,648,437 B2  
APPLICATION NO. : 12/790390  
DATED : February 11, 2014  
INVENTOR(S) : Mazzillo Page 1 of 1

It is certified that error appears in the above-identified patent and that said Letters Patent is hereby corrected as shown below:

In the Claims

Column 9, Line 35      Delete: "of" between "having" and "a"

Column 10, Line 27     Delete: "of" between "having" and "a"

Signed and Sealed this  
Ninth Day of September, 2014

Michelle K. Lee  
*Deputy Director of the United States Patent and Trademark Office*